(12) United States Patent
Fukuhisa

(10) Patent No.: US 6,813,290 B1
(45) Date of Patent: Nov. 2, 2004

(54) SEMICONDUCTOR LASER DEVICE AND METHOD FOR FABRICATING THE SAME

(75) Inventor: Toshiya Fukuhisa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 114 days.

(21) Appl. No.: 09/717,137

(22) Filed: Nov. 22, 2000

(30) Foreign Application Priority Data

Nov. 25, 1999 (JP) .......................................... 11-333783

(51) Int. Cl.$^7$ ................................................ H01S 5/00
(52) U.S. Cl. ............................. 372/43; 372/44; 372/45; 372/23; 372/50
(58) Field of Search ............................. 372/43; 327/43, 327/44, 50, 23

(56) References Cited

U.S. PATENT DOCUMENTS

| | | | | |
|---|---|---|---|---|
| 5,412,678 A | * | 5/1995 | Treat et al. ..................... | 372/45 |
| 5,963,568 A | * | 10/1999 | Paoli ........................... | 372/23 |
| 5,999,553 A | * | 12/1999 | Sun ............................. | 372/50 |
| 6,167,074 A | * | 12/2000 | Sun et al. ...................... | 372/46 |

FOREIGN PATENT DOCUMENTS

| | | |
|---|---|---|
| JP | 11-195837 | 7/1999 |
| JP | 2000-244060 | 9/2000 |

OTHER PUBLICATIONS

K. Nemoto et al., "A Laser Coupler for DVD/CD Playback by Using Monolithic Integrated 2–wavelength LDs", The 60$^{th}$ Autumn Technical Meeting of The Japan Society of Applied Physics, 3a–ZC–10, Sep. 1999. (Partial English translation).

\* cited by examiner

*Primary Examiner*—Don Wong
*Assistant Examiner*—Dung Nguyen
(74) *Attorney, Agent, or Firm*—Nixon Peabody, LLP; Donald R. Studebaker

(57) ABSTRACT

An etching control layer with a composition different from that of a compound semiconductor substrate is deposited over the surface of the substrate. Then, a first multilayer structure, made up of multiple semiconductor layers including a first active layer with a composition different from that of the etching control layer, is defined over the etching control layer. A first semiconductor laser structure is formed out of the first multilayer structure on a first region of the substrate by selectively etching and patterning the first multilayer structure. A second multilayer structure, made up of multiple semiconductor layers including a second active layer, is defined over the surface of the substrate as well as over the first semiconductor laser structure. A second semiconductor laser structure is formed out of the second multilayer structure on a second region of the substrate by selectively etching and patterning the second multilayer structure.

8 Claims, 5 Drawing Sheets

SEMICONDUCTOR LASER DEVICE AND METHOD FOR FABRICATING THE SAME

BACKGROUND OF THE INVENTION

The present invention relates to a semiconductor laser device mainly used as a light source in a pickup for an optical disk, and also relates to a method for fabricating the same.

A red-light-emitting semiconductor laser device, which is used as a light source for a digital video disc (which will be herein called a DVD), has an oscillation wavelength in the band from 630 nm to 690 nm. This is shorter than the oscillation wavelength (in the band of 780 nm) of an infrared semiconductor laser device used for a known compact disc (which will be herein called a CD). Therefore, data can be read not only from DVDs but also from CDs by using the red-light-emitting semiconductor laser device.

However, an optical disc like a write once CD (which will be herein called a CD-R), in which an organic compound is used as its recording medium, has an optical reflectance that depends strongly on wavelength. For this and other reasons, it is impossible to read data from CD-Rs with the red-light-emitting semiconductor laser device, and the infrared semiconductor laser device is needed to read data from CD-Rs.

Therefore, to read data from both DVDs and CD-Rs alike, an optical pickup should be provided with two light sources, i.e., a red-light-emitting semiconductor laser device and an infrared semiconductor laser device.

As techniques of providing two light sources for an optical pickup, hybrid integration technique, by which red-light-emitting and infrared semiconductor laser devices are provided independently, and monolithic integration technique, by which red-light-emitting and infrared semiconductor lasers are integrated on a single substrate, are known.

In view of technical difficulty and productivity, the hybrid integration is prevailing at present. To further reduce the size and costs of the optical pickups, however, the monolithic integration could be advantageous in future.

For that reason, a semiconductor laser device, implemented by forming a red-light-emitting semiconductor laser structure for a wavelength band of 650 nm and an infrared semiconductor laser structure for a wavelength band of 780 nm side by side on a single GaAs substrate, was proposed at the 60th Japan Society of Applied Physics Autumn Technical Meeting 3a-ZC-10 (1999).

A red-light-emitting semiconductor laser structure is usually a multilayer structure made up of quaternary mixed crystals $(Al_xGa_{1-x})_yIn_{1-y}P$ (where $0 \leq x \leq 1$ and $0 \leq y \leq 1$), which will be herein simply labeled as AlGaIP), which consist essentially of Al, Ga, In and P. And an infrared semiconductor laser structure is usually a multilayer structure made up of ternary mixed crystals $(Al_zGa_{1-z}As$ (where $0 \leq z \leq 1$), which will be herein simply labeled as AlGaAs), which consist essentially of Al, Ga and As.

Also, to form two semiconductor laser structures on a single substrate, a first multilayer structure, made up of multiple semiconductor layers including a first active layer, is defined on the substrate. Then, the first multilayer structure is patterned to form a first semiconductor laser structure. Next, a second multilayer structure, made up of multiple semiconductor layers including a second active layer, is defined on the substrate, on which the first semiconductor laser structure has been formed. Then, the second multilayer structure is patterned, thereby defining a second semiconductor laser structure.

Hereinafter, a known monolithic semiconductor laser device, implemented by forming a red-light-emitting semiconductor laser structure on a first region of a substrate and an infrared semiconductor laser structure on a second region of the same substrate, will be described with reference to FIG. 5.

As shown in FIG. 5, a buffer layer 102 is formed out of an n-type GaAs layer on an n-type GaAs substrate 101.

A first multilayer structure, consisting of first n-type cladding layer 103A formed out of an n-type AlGaAs layer, first active layer 104A formed out of a GaAs layer and first p-type cladding layer 105A formed out of a p-type AlGaAs layer, is defined on a first region of the buffer layer 102, and constitutes a red-light-emitting semiconductor laser structure.

A second multilayer structure, consisting of second n-type cladding layer 106A formed out of an n-type AlGaInP layer, second active layer 107A formed out of a GaInP layer and second p-type cladding layer 108A formed out of a p-type AlGaInP layer, is defined on a second region of the buffer layer 102, and constitutes an infrared semiconductor laser structure.

A lower electrode 109, which becomes a common electrode, is formed on the lower surface of the n-type GaAs substrate 101. A first upper electrode 110 is formed on the first p-type cladding layer 105A and a second upper electrode 111 is formed on the second p-type cladding layer 108A.

Hereinafter, a method for fabricating the known semiconductor laser device will be described with reference to FIGS. 6(a) through 6(d).

First, a buffer layer 102 formed out of an n-type GaAs layer is deposited on an n-type GaAs substrate 101 and then n-type AlGaAs layer 103, GaAs layer 104 and p-type AlGaAs layer 105 are deposited in this order over the buffer layer 102, thereby defining a first multilayer structure as shown in FIG. 6(a).

Next, the first multilayer structure is etched and patterned into a predetermined shape, thereby forming first n-type cladding layer 103A out of the n-type AlGaAs layer 103, first active layer 104A out of the GaAs layer 104 and first p-type cladding layer 105A out of the p-type AlGaAs layer 104 on a first region of the buffer layer 102 as shown in FIG. 6(b). In this manner, a red-light-emitting semiconductor laser structure is formed out of the first multilayer structure.

Thereafter, n-type AlGaInP layer 106, GaInP layer 107 and p-type AlGaInP layer 108 are deposited in this order over the entire surface of the buffer layer 102, on which the red-light-emitting semiconductor laser structure has been defined, thereby forming a second multilayer structure as shown in FIG. 6(c).

Next, the second multilayer structure is etched and patterned into a predetermined shape, thereby forming second n-type cladding layer 106A out of the n-type AlGaInP layer 106, second active layer 107A out of the GaInP layer 107 and second p-type cladding layer 108A out of the p-type AlGaInP layer 108 on a second region of the buffer layer 102 as shown in FIG. 6(d). In this manner, an infrared semiconductor laser structure is formed out of the second multilayer structure.

Then, a lower electrode 109 is formed on the lower surface of the n-type GaAs substrate 101. And a first upper electrode 110 is formed on the first p-type cladding layer 105A and a second upper electrode 111 is formed on the second p-type cladding layer 108A. Then, the known semiconductor laser device as shown in FIG. 5 can be obtained.

In the known method for fabricating a semiconductor laser device, the first multilayer structure is etched and patterned into a predetermined shape, thereby exposing the buffer layer 102. Then, the n-type AlGaInP layer 106, GaInP layer 107 and p-type AlGaInP layer 108 are deposited in this order over the buffer layer 102 to form the infrared semiconductor laser structure.

In the step of exposing the buffer layer 102 formed out of the n-type GaAs layer, however, over etching should be performed on the lowermost n-type AlGaAs layer 103 and the buffer layer 102 is etched excessively because the compositions of the GaAs and AlGaAs layers are similar. For this reason, the surface of the buffer layer 102 might become rugged considerably or a hole might be made in the buffer layer 102, and the surface of the buffer layer 102 becomes adversely uneven.

If the n-type AlGaInP layer 106, GaInP layer 107 and p-type AlGaInP layer 108 are deposited in this order over the buffer layer 102 with the uneven surface, the resultant semiconductor layers have disordered crystal structures and nonuniform compositions, thus causing a problem that a satisfactory infrared semiconductor laser structure cannot be obtained.

The above problem also arises likewise where the first multilayer structure to be the infrared semiconductor laser structure is formed, etched and patterned into the predetermined shape to expose the buffer layer 102 and then the second multilayer structure to be the red-light-emitting semiconductor laser structure is defined on the buffer layer 102.

SUMMARY OF THE INVENTION

The present invention is applicable to fabricating a monolithic semiconductor laser device by etching and patterning a first multilayer structure into a predetermined shape and then by defining a second multilayer structure. And in view of the foregoing, an object of the present invention is to improve the crystallinity of the second multilayer structure by getting the second multilayer structure well defined.

To achieve this object, an inventive method for fabricating a semiconductor laser device includes the steps of: depositing an etching control layer, which has a composition different from that of a compound semiconductor substrate, over the entire surface of the substrate; defining a first multilayer structure over the entire surface of the etching control layer; forming a first semiconductor laser structure out of the first multilayer d-structure-on a first region of the substrate by selectively etching and patterning the first multilayer structure; defining a second multilayer structure over the entire surface of the substrate as well as over the first semiconductor laser structure; and forming a second semiconductor laser structure out of the second multilayer structure on a second region of the substrate by selectively etching and patterning the second multilayer structure. The first multilayer structure is made up of multiple semiconductor layers including a first active layer with a composition different from that of the etching control layer. The second multilayer structure is made up of multiple semiconductor layers including a second active layer.

In the inventive method for fabricating a semiconductor laser device, a first multilayer structure, made up of multiple semiconductor layers including a first active layer with a composition different from that of an etching control layer, is defined over the etching control layer deposited over a compound semiconductor substrate. And then, a first semiconductor laser structure is defined by selectively etching and patterning the first multilayer structure. Thus, etching of the first multilayer structure can be stopped at the etching control layer. In this case, it is possible to avoid a situation, in which a second region of the substrate is damaged, in the step of etching the first multilayer structure. Therefore, a second multilayer structure made up of multiple semiconductor layers including a second active layer can be well defined on the second region of the substrate. As a result, it is possible to improve the property of a second semiconductor laser structure formed out of the second multilayer structure.

In the inventive method for fabricating a semiconductor laser device, the step of forming the first semiconductor laser structure is preferably performed so that an etch rate of the first multilayer structure is higher than that of the etching control layer.

In this manner, etching of the first multilayer structure can be stopped at the etching control layer just as intended, and it is possible to avoid a situation, in which the second region of the compound semiconductor substrate is damaged by etching, with much more certainty.

The inventive method for fabricating a semiconductor laser device preferably further includes the step of selectively etching away part of the etching control layer, which exists on the second region, between the step of forming the first semiconductor laser structure and the step of defining the second multilayer structure.

In this manner, the second multilayer structure, made up of the multiple semiconductor layers including the second active layer, can be defined in an even better shape.

The inventive method for fabricating a semiconductor laser device preferably further includes the steps of: depositing a buffer layer over the entire surface of the etching control layer between the step of depositing the etching control layer and the step of defining the first multilayer structure; and selectively etching away part of the buffer layer, which exists on the second region, between the step of forming the first semiconductor laser structure and the step of defining the second multilayer structure.

In this manner, the first and second multilayer structures can be well defined on the first and second regions of the compound semiconductor substrate, respectively.

If the inventive method for fabricating a semiconductor laser device includes the step of depositing the buffer layer over the etching control layer, the step of selectively etching away the part of the buffer layer existing on the second region is preferably performed so that an etch rate of the buffer layer is higher than that of the etching control layer.

In this manner, the part of the buffer layer existing on the second region can be etched away just as intended, and the second multilayer structure can be defined in an even better shape.

If the inventive method for fabricating a semiconductor laser device includes the step of depositing the buffer layer over the etching control layer, the etching control layer is preferably formed out of a Group III-V compound semiconductor layer containing P and the buffer layer is preferably formed out of a GaAs layer.

In this way, the selective etching can be easily performed so that the etch rate of the buffer layer is higher than that of the etching control layer. Therefore, it is possible to etch away the part of the buffer layer existing on the second region just as intended.

In the inventive method for fabricating a semiconductor laser device, the etching control layer is preferably made of $(Al_xGa_{1-x})_yIn_{1-y}P$ (where $0 \leq x \leq 1$ and $0 \leq y \leq 1$) and the first multilayer structure preferably includes semiconductor layers made of $Al_zGa_{1-z}As$ (where $0 \leq z \leq 1$).

In this way, etching of the first multilayer structure can be stopped at the etching control layer to avoid a situation in which the second region of the compound semiconductor substrate is damaged. Therefore, the second multilayer structure can be well defined.

In the inventive method for fabricating a semiconductor laser device, the etching control layer is preferably made of $(Al_xGa_{1-x})_yI_{1-y}P$ (where $0 \leq x \leq 1$ and $0 \leq y \leq 1$) and the first multilayer structure preferably includes semiconductor layers made of $Al_xGa_{1-x}As$ (where $0 \leq z \leq 1$).

In this way, etching of the first multilayer structure can be stopped at the etching control layer just as intended, and it is possible to avoid a situation, in which the second region of the compound semiconductor substrate is damaged, with much certainty.

In the inventive method for fabricating a semiconductor laser device, the etching control layer is preferably made of $Al_zGa_{1-z}As$ (where $0 \leq z \leq 1$) and the first multilayer structure preferably includes semiconductor layers made of $(Al_xGa_{1-x})_yIn_{1-y}P$ (where $0 \leq x \leq 1$ and $0 \leq y \leq 1$).

In this way, etching of the first multilayer structure can be stopped at the etching control layer just as intended, and it is possible to avoid a situation, in which the second region of the compound semiconductor substrate is damaged, with much certainty.

A semiconductor laser device according to the present invention includes: an etching control layer, which is formed on a first region of a compound semiconductor substrate and has a composition different from that of the substrate; a first semiconductor laser structure, which is defined over the etching control layer and which is made up of multiple semiconductor layers including a first active layer with a composition different from that of the etching control layer; and a second semiconductor laser structure, which is defined on a second region of the substrate and which is made up of multiple semiconductor layers including a second active layer.

In the inventive semiconductor laser device, the multiple semiconductor layers, including the first active layer with a composition different from that of the etching control layer, are deposited over the etching control layer formed over the compound semiconductor substrate. And then it is possible to define the first semiconductor laser structure by selectively etching and patterning the multiple semiconductor layers. Therefore, a situation in which the second region of the substrate is damaged by etching is avoidable, and it is possible to deposit the multiple semiconductor layers, including the second active layer, in good shapes on the second region of the substrate. As a result, it is possible to improve the property of the second semiconductor laser structure.

In the inventive semiconductor laser device, no part of the etching control layer preferably exists between the second region of the substrate and the second semiconductor laser structure.

In such an embodiment, the multiple semiconductor layers, including the second active layer, to be the second semiconductor laser structure can be deposited in even better shapes.

In the inventive semiconductor laser device, the etching control layer preferably has a thickness of more than 0 μm and equal to or less than 0.1 μm.

Then, the etching control layer will have a minimum effect on the deposition of the multiple semiconductor layers including the first active layer. Consequently, the property of the first semiconductor laser structure, made up of the multiple semiconductor layers including the first active layer, improves.

The inventive semiconductor laser device preferably further includes a buffer layer between the etching control layer, formed on the first region of the substrate, and the first semiconductor laser structure.

Then, the multiple semiconductor layers including the first active layer are deposited in good shapes, thus improving the property of the first semiconductor laser structure made up of the multiple semiconductor layers including the first active layer.

If the inventive semiconductor laser device includes the buffer layer between the etching control layer and the first semiconductor laser structure, the etching control layer is preferably formed out of a Group III-V compound semiconductor layer containing P and the buffer layer is preferably formed out of a GaAs layer.

In such an embodiment, the part of the buffer layer existing on the second region can be etched away just as intended. Therefore, the multiple semiconductor layers, including the second active layer, can be deposited in good shapes to improve the property of the first semiconductor structure.

In the inventive semiconductor laser device, the compound semiconductor substrate is preferably a GaAs substrate and the etching control layer is preferably formed out of a Group III-V compound semiconductor layer containing P.

In that case, the first semiconductor laser structure, made up of the multiple semiconductor layers including the first active layer, can be defined without damaging the second region of the substrate. Therefore, the multiple semiconductor layers including the second active layer can be deposited in good shapes on the second region of the substrate.

In the inventive semiconductor laser device, the etching control layer is preferably made of $(Al_xGa_{1-x})_yIn_{1-x}P$ (where $0 \leq x \leq 1$ and $0 \leq y \leq 1$) and the first semiconductor laser structure preferably includes semiconductor layers made of $Al_zGa_{1-x}As$ (where $0 \leq z \leq 1$) .

Then, the first semiconductor laser structure, made up of the multiple semiconductor layers including the first active layer, can be defined without damaging the second region of the substrate. Therefore, the multiple semiconductor layers including the second active layer can be deposited in good shapes on the second region of the substrate.

In the inventive semiconductor laser device, the etching control layer is preferably made of $Al_zGa_{1-z}As$ (where $0 \leq z \leq 1$) and the first multilayer structure preferably includes semiconductor layers made of $(Al_xGa_{1-x})_yIn_{1-y}P$ (where $0 \leq x \leq 1$ and $0 \leq y \leq 1$).

In such an embodiment, the first semiconductor laser structure, made up of the multiple semiconductor layers including the first active layer, can be defined without damaging the second region of the substrate. Therefore, the multiple semiconductor layers including the second active layer can be deposited in good shapes on the second region of the substrate.

DESCRIPTION OF THE PREFERRED EMBODIMENTS

Embodiment 1

Hereinafter, a semiconductor laser device according to a first embodiment of the present invention will be described with reference to FIG. 1.

Figure 1:
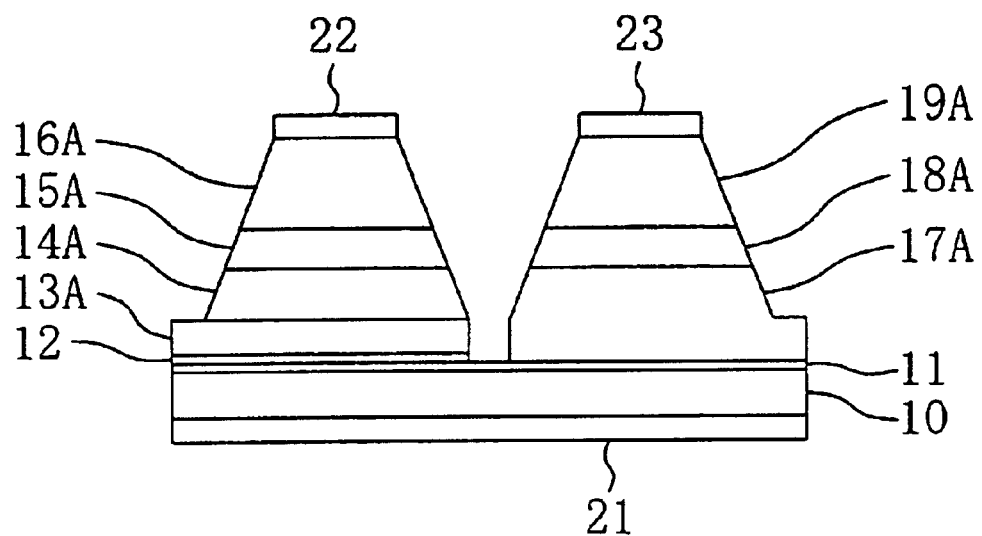
FIG. 1 is a cross-sectional view of a semiconductor laser device according to a first embodiment of the present invention.

As shown in FIG. 1, a first buffer layer 11 is formed out of an n-type GaAs layer with a thickness of about 0.1 $\mu$m on an n-type GaAs substrate 10.

An etching control layer 12 is formed out of an n-type GaInP layer on a first region of the first buffer layer 11. And a patterned second buffer layer 13A is formed out of an n-type GaAs layer on the etching control layer 12. Also, first n-type cladding layer 14A formed out of an n-type AlGaAs layer, first active layer 15A formed out of a GaAs layer and first p-type cladding layer 16A formed out of a p-type AlGaAs layer are stacked in this order over the patterned second buffer layer 13A. And an infrared semiconductor laser structure is made up of the first n-type cladding, first active and first p-type cladding layers 14A, 15A and 16A.

On the other hand, second n-type cladding layer 17A formed out of an n-type AlGaInP layer, second active layer 18A formed out of a GaInP layer and second p-type cladding layer 19A formed out of a p-type AlGaInP layer are stacked in this order on a second region of the first buffer layer 11. And a red-light-emitting semiconductor laser structure is made up of the second n-type cladding, second active and second p-type cladding layers 17A, 18A and 19A.

Further, a lower electrode 21 is formed on the lower surface of the GaAs substrate 10. And first and second upper electrodes 22 and 23 are formed on the upper surfaces of the first and second p-type cladding layers 16A and 19A, respectively.

Hereinafter, a method for fabricating the semiconductor laser device of the first embodiment will be described with reference to FIGS. 3(a) through 3(d).

Figure 3A:
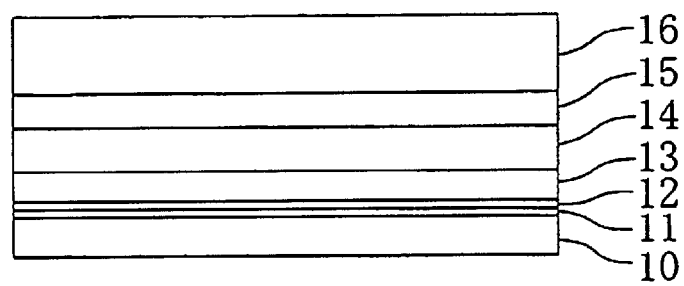
FIGS. 3(a) through 3(d) are cross-sectional views illustrating respective process steps of a method for fabricating the semiconductor laser device of the first embodiment.

First, a first buffer layer 11, formed out of an n-type GaAs layer with a thickness of about 0.1 $\mu$m, and an etching control layer 12, formed out of an n-type GaInP layer with a thickness of about 0.01 $\mu$m, are deposited in this order over an n-type GaAs substrate 10 as shown in FIG. 3(a). Then, second buffer layer 13 formed out of an n-type GaAs layer with a thickness of about 0.3 $\mu$m, n-type AlGaAs layer 14, GaAs layer 15 and p-type AlGaAs layer 16 are deposited in this order over the etching control layer 12, thereby defining a first multilayer structure.

Figure 3B:
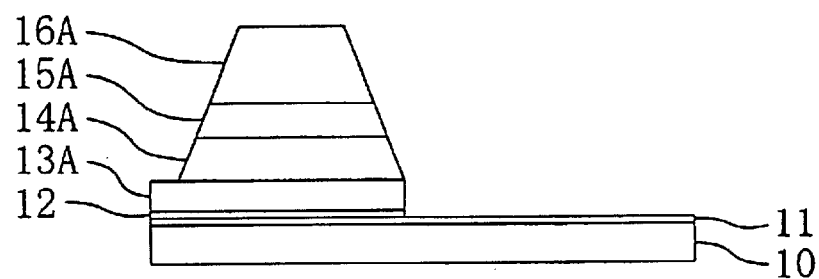

Next, as shown in FIG. 3(b), the first multilayer structure is wet-etched using an etchant, which makes the etch rate of the AlGaAs and GaAs layers higher than that of the GaInP layer (e.g., an etchant containing sulfuric acid and hydrogen peroxide water mixed at 1:1), until the etching control layer 12 is exposed. In this manner, first n-type cladding layer 14A formed out of the n-type AlGaAs layer 14, first active layer 15A formed out of the GaAs layer 15, first p-type cladding layer 16A formed out of the p-type AlGaAs layer 16 and patterned second buffer layer 13A are stacked on a first region of the GaAs substrate 10. And an infrared semiconductor laser structure made up of the first n-type cladding, first active and first p-type cladding layers 14A, 15A and 16A can be obtained.

Subsequently, the etching control layer 12 is wet-etched using an etchant, which makes the etch rate of the GaInP layer higher than that of the GaAs layers (e.g., an etchant consisting essentially of hydrochloric acid), until the first buffer layer 11 is exposed. In this manner, the etching control layer 12 is left only in the first region.

Figure 3C:
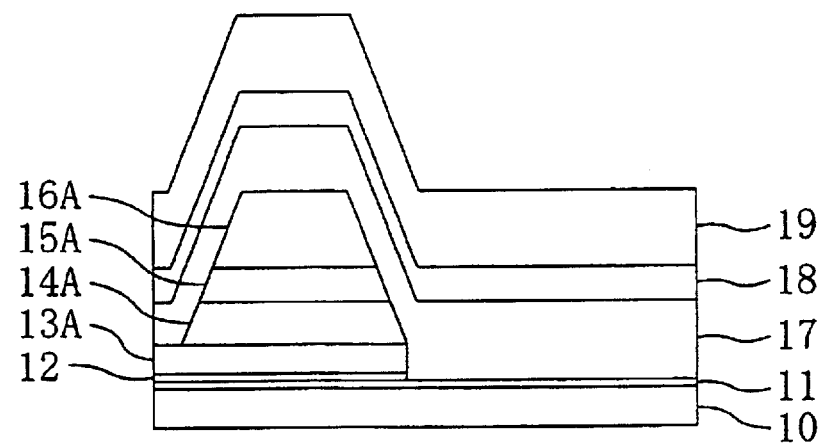

Next, as shown in FIG. 3(c), n-type AlGaInP, GaInP and p-type AlGaInP layers 17, 18 and 19 are stacked in this order over the entire surfaces of the first buffer layer 11 and infrared semiconductor laser structure, thereby defining a second multilayer structure.

Figure 3D:
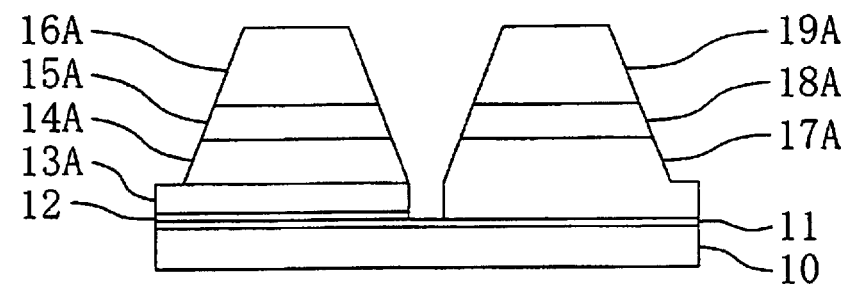

Then, as shown in FIG. 3(d), the second multilayer structure is wet etched using an etchant making the etch rate of the AlGaInP and GaInP layers higher than that of the GaAs layers (e.g., an etchant consisting essentially of hydrochloric acid), thereby forming second n-type cladding, second active and second p-type cladding layers 17A, 18A and 19A out of the n-type AlGaInP, GaInP and p-type AlGaInP layers 17, 18 and 19, respectively, on a second region of the GaAs substrate 10. In this manner, a red-light-emitting semiconductor laser structure made up of the second n-type cladding, second active and second p-type cladding layers 17A, 18A and 19A can be obtained.

Thereafter, a lower electrode 21 is formed on the lower surface of the GaAs substrate 10. And first and second upper electrodes 22 and 23 are formed on the upper surfaces of the first and second p-type cladding layers 16A and 19A, respectively. In this manner, the semiconductor device of the first embodiment shown in FIG. 1 can be obtained.

According to the first embodiment, the first multilayer structure, made up of the n-type AlGaAs, GaAs and p-type AlGaAs layers 14, 15 and 16, is defined on the second buffer layer 13 formed out of a GaAs layer with a thickness of about 0.3 $\mu$m. Therefore, although the etching control layer 12 formed out of an n-type GaInP layer exists over the GaAs substrate 10, the first multilayer structure, and eventually the infrared semiconductor laser structure, can have their crystallinity improved.

Also, even if the surface of the GaAs substrate 10 is not flat enough or has degraded crystallinity due to defects or contamination, for example, the second multilayer structure to be the red-light-emitting semiconductor laser structure can be defined well because the first buffer layer 11 formed out of an n-type GaAs layer exists on the GaAs substrate 10.

Further, the etching control layer 12 formed out of an n-type GaInP layer exists under the second buffer layer 13 formed out of an n-type GaAs layer. Accordingly, etching of the first multilayer structure, made up of the second buffer, n-type AlGaAs, GaAs and p-type AlGaAs layers 13, 14, 15 and 16, is stopped at the upper surface of the etching control layer 12.

Furthermore, the first buffer layer 11 formed out of an n-type GaAs layer exists under the etching control layer 12 formed out of an n-type GaInP layer. Accordingly, etching of the etching control layer 12 is stopped at the upper surface of the first buffer layer 11.

Consequently, the second multilayer structure to be the red-light-emitting semiconductor laser can be well defined because the second region of the first buffer layer 11 is unlikely to be damaged by etching.

It should be noted that the first buffer layer 11 is not easily damaged by etching but might possibly be damaged slightly.

In that case, a GaAs layer is preferably deposited to an appropriate thickness over the first buffer layer 11, which has been exposed by etching, and the n-type AlGaInP layer 17 is preferably deposited on the GaAs layer. Then, the second multilayer structure can be defined in an even better shape.

Embodiment 2

Hereinafter, a semiconductor laser device according to a second embodiment of the present invention will be described with reference to FIG. 2.

Figure 2:
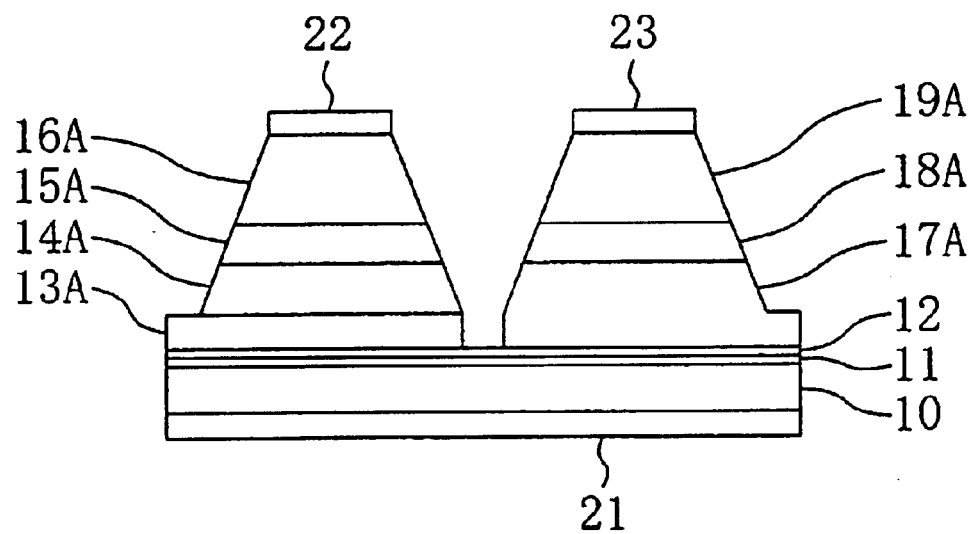
FIG. 2 is a cross-sectional view of a semiconductor laser device according to a second embodiment of the present invention.

As shown in FIG. 2, a first buffer layer 11, formed out of an n-type GaAs layer with a thickness of about 0.1 μm, and an etching control layer 12, formed out of an n-type GaInP layer, are stacked in this order over the entire surface of an n-type GaAs substrate 10.

Patterned second buffer layer 13A formed out of an n-type GaAs layer, first n-type cladding layer 14A formed out of an n-type AlGaAs layer, first active layer 15A formed out of a GaAs layer and first p-type cladding layer 16A formed out of a p-type AlGaAs layer are stacked in this order on a first region of the etching control layer 12. And an infrared semiconductor laser structure is made up of the first n-type cladding, first active and first p-type cladding layers 14A, 15A and 16A.

On the other hand, second n-type cladding layer 17A formed out of an n-type AlGaInP layer, second active layer 18A formed out of a GaInP layer and second p-type cladding layer 19A formed out of a p-type AlGaInP layer are stacked in this order on a second region of the etching control layer 12. And a red-light-emitting semiconductor laser structure is made up of the second n-type cladding, second active and second p-type cladding layers 17A, 18A and 19A.

Further, a lower electrode 21 is formed on the lower surface of the GaAs substrate 10. And first and second upper electrodes 22 and 23 are formed on the upper surfaces of the first and second p-type cladding layers, 16A and 19A, respectively.

Hereinafter, a method for fabricating the semiconductor, laser device of the second embodiment will be described with reference to FIGS. 4(a) through 4(d).

Figure 4A:
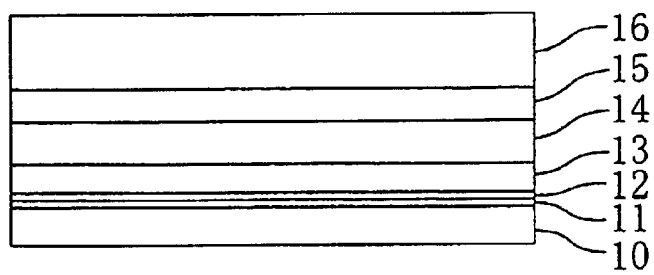
FIGS. 4(a) through 4(d) are cross-sectional views illustrating respective process steps of a method for fabricating the semiconductor laser device of the second embodiment.

First, a first buffer layer 11, formed out of an n-type GaAs layer with a thickness of about 0.1 μm, and an etching control layer 12, formed out of an n-type GaInP layer with a thickness of about 0.01 μm, are deposited in this order over an n-type GaAs substrate 10 as shown in FIG. 4(a). Then, second buffer layer 13 formed out of an n-type GaAs layer with a thickness of about 0.3 cm, n-type AlGaAs layer 14, GaAs layer 15 and p-type AlGaAs layer 16 are stacked in this order over the etching control layer 12, thereby defining a first multilayer structure.

Figure 4B:
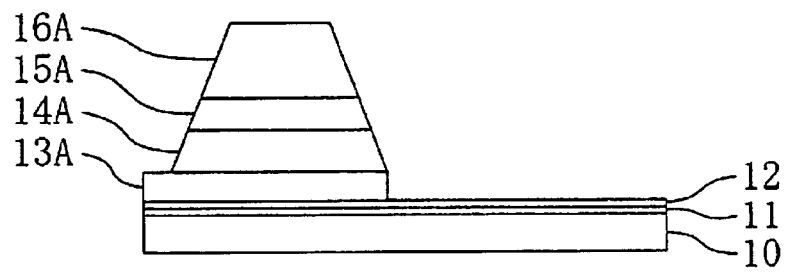

Next, as shown in FIG. 4(b), the first multilayer structure is selectively wet-etched to expose a second region of the etching control layer 12. In this manner, first n-type cladding layer 14A formed out of the n-type AlGaAs layer 14, first active layer 15A formed out of the GaAs layer 15, first p-type cladding layer 16A formed out of the p-type AlGaAs layer 16 and patterned second buffer layer 13A are stacked on a first region of the GaAs substrate 10. And an infrared semiconductor laser structure made up of the first n-type cladding, first active and first p-type cladding layers 14A, 15A and 16A can be obtained.

Figure 4C:
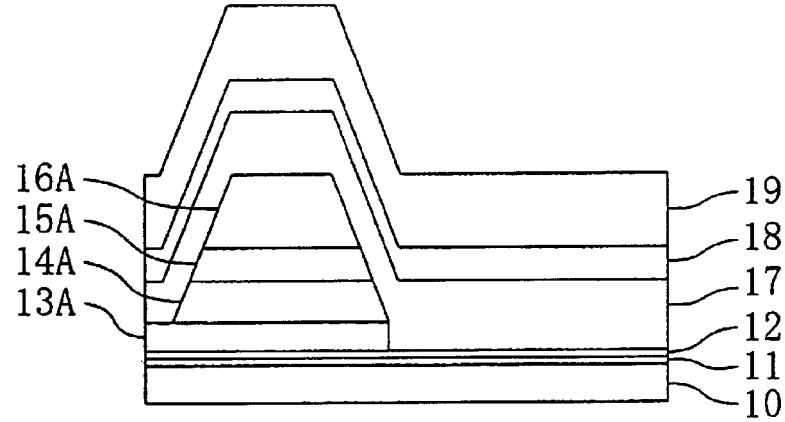

Subsequently, as shown in FIG. 4(c), n-type AlGaInP, GaInP and p-type AlGaInP layers 17, 18 and 19 are deposited in this order over the entire surfaces of the etching control layer 12 and infrared semiconductor laser structure, thereby defining a second multilayer structure.

Figure 4D:
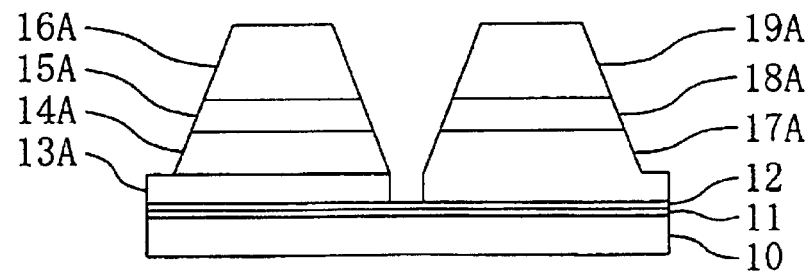
Figure 5:
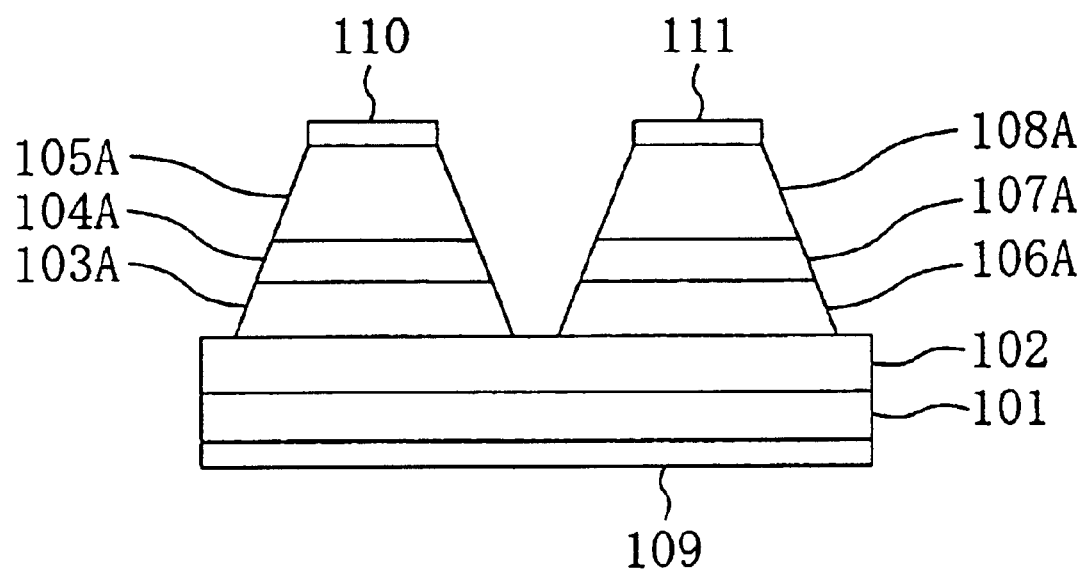
FIG. 5 is a cross-sectional view of a known semiconductor laser device.
Figure 6A:
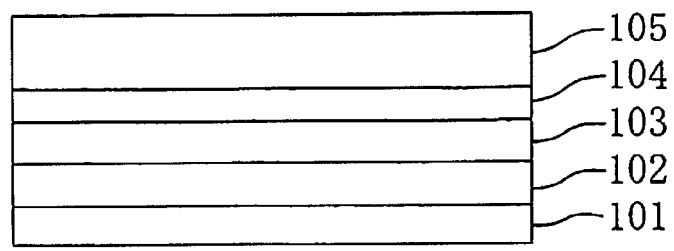
FIGS. 6(a) through 6(d) are cross-sectional views illustrating respective process steps of a method for fabricating the known semiconductor laser device.
Figure 6B:
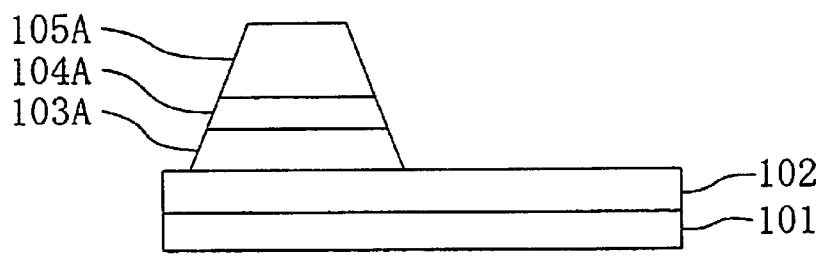
Figure 6C:
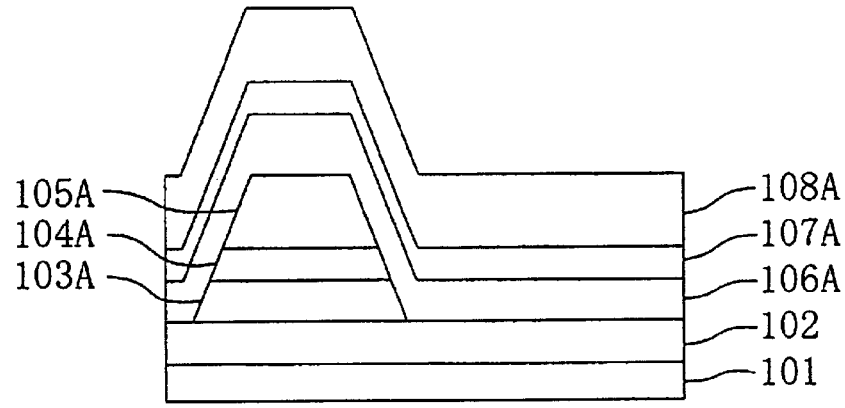
Figure 6D:
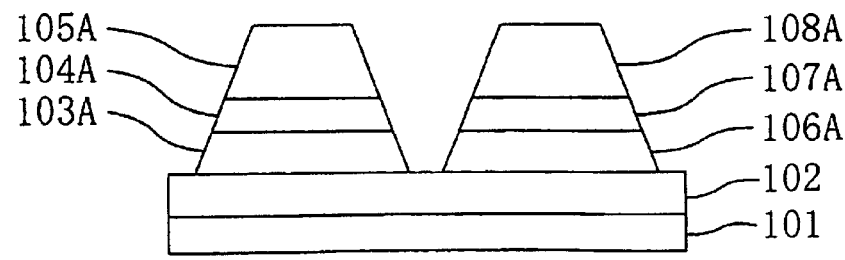

Next, as shown in FIG. 4(d), the second multilayer structure is selectively wet-etched, thereby forming second n-type cladding, second active and second p-type cladding layers 17A, 18A and 19A out of the n-type AlGaInP, GaInP and p-type AlGaInP layers 17, 18 and 19, respectively, on the second region of the etching control layer 12. In this manner, a red-light-emitting semiconductor laser structure made up of the second n-type cladding, second active and second p-type cladding layers 17A, 18A and 19A can be obtained.

Thereafter, a lower electrode 21 is formed on the lower surface of the GaAs substrate 10. And first and second upper electrodes 22 and 23 are formed on the upper surfaces of the first and second p-type cladding layers 16A and 19A, respectively. In this manner, the semiconductor device of the second embodiment shown in FIG. 2 can be obtained.

According to the second embodiment, the first multilayer structure, made up of the n-type AlGaAs, GaAs and p-type AlGaAs layers 14, 15 and 16, is defined on the second buffer layer 13 formed out of the GaAs layer with a thickness of about 0.3 μm. Therefore, although the etching control layer 12 formed out of an n-type GaInP layer exists over the GaAs substrate 10, the first multilayer structure to be the infrared semiconductor laser structure can have its crystallinity improved.

Also, even if the surface of the GaAs substrate 10 is not flat enough or has degraded crystallinity due to defects or contamination, for example, the second multilayer structure to be the red-light-emitting semiconductor laser structure can be well defined because the first buffer layer 11 formed out of an n-type GaAs layer exists on the GaAs substrate 10.

Further, the etching control layer 12 formed out of the n-type GaInP layer exists under the second buffer layer 13 formed out of the n-type GaAs layer. Accordingly, etching of the first multilayer structure, made up of the second buffer, n-type AlGaAs, GaAs and p-type AlGaAs layers 13, 14, 15 and 16, is stopped at the upper surface of the etching control layer 12.

Consequently, the second multilayer structure to be the red-light-emitting semiconductor laser structure can be well defined because the etching control layer 12 is not easily damaged by etching.

It should be noted that the etching control layer 12 is deposited on the first buffer layer 11 in the first and second embodiments. Alternatively, the etching control layer 12 may be deposited directly on the GaAs substrate 10 without depositing the first buffer layer 11 on the GaAs substrate 10. In that case, a situation in which the GaAs substrate 10 is damaged by etching is avoidable.

Also, the etching control layer 12 has a thickness of 0.01 μm in the first and second embodiments. However, the etching control layer 12 may have a thickness of more than 0 μm and equal to or less than 0.1 μm. In this manner, the etching control layer 12 will have a minimum effect on the second buffer layer 13 for the first and second embodiments and on the n-type AlGaInP layer 17 for the second embodiment. Therefore, the first and second multilayer structures can be well defined.

Further, the first and second active layers 14A and 18 in the first and second embodiments may have either a single quantum well structure or a multiple quantum well structure.

Furthermore, the etching control layer 12 in the first and second embodiments does not have to be a GaInP layer but may be a semiconductor layer, which has a lattice constant almost equal to that of a GaAs layer and a sufficiently high etch selectivity against the GaAs layers. Also, the etching control layer 12 does not have to be a single layer but may be made up of multiple layers, which are composed of mixed crystals containing a first Group V element (e.g., As) and mixed crystals containing a, second Group V element (e.g., P).

Moreover, in the first and second embodiments, the etching control layer 12 is formed out of the AlGaIp layer and the first multilayer structure is made up of multiple semiconductor layers including the AlGaAs layers. Alternatively, the etching control layer 12 may be formed out of an AlGaAs layer and the first multilayer structure may be made up of multiple semiconductor layers including AlGaInP layers.

In that case, etching of the first multilayer structure can also be stopped at the upper surface of the etching control layer 12, and it is possible to avoid a situation, in which the second region of the GaAs substrate 10 is damaged, just as intended.

What is claimed is:

1. A semiconductor laser device comprising:
    an etching control layer, which is formed on a first region of a compound semiconductor substrate and has a composition different from a composition of the substrate;
    a first semiconductor laser structure, which is defined over the etching control layer and which is made up of a first multiple semiconductor layers including a first active layer with a composition different from that of the etching control layer; and
    a second semiconductor laser structure, which is defined on a second region of the substrate and which is made up of a second multiple semiconductor layers including a second active layer,
    wherein no part of the etching control layer exists between the second region of the substrate and the second semiconductor laser structure,
    wherein the first multiple semiconductor layers are made of III-V compound, the V element is one selected from the group consisting of As and P,
    wherein the second multiple semiconductor layers are made of III-V compound, the V element is another selected from the group consisting of As and P, and
    wherein the etching control layer has a V element different from the V element comprising of the first multiple semiconductor layers.

2. A semiconductor laser device according to claim 1, wherein the etching control layer has a thickness of more than 0 m and equal to or less than 0.1 m.

3. A semiconductor laser device according to claim 1, further comprising a buffer layer between the etching control layer, formed on the first region of the substrate, and the first semiconductor laser structure.

4. A semiconductor laser device according to claim 3, wherein the etching control layer is formed out of a Group III-V compound semiconductor layer containing P, and
    wherein the buffer layer is formed out of a GaAs layer.

5. A semiconductor laser device according to claim 1, wherein the compound semiconductor substrate is a GaAs substrate, and
    wherein the etching control layer is formed out of a Group III-V compound semiconductor layer containing P.

6. A semiconductor laser device according to claim 1, wherein the etching control layer is made of $(Al_xGa_{1-x})_yIn_{1-y}P$ (where $0 \leq x \leq 1$ and $0 \leq y \leq 1$), and
    wherein the first semiconductor laser structure includes semiconductor layers made of $Al_zGa_{1-z}As$ (where $0 \leq z \leq 1$).

7. A semiconductor laser device according to claim 1, wherein the etching control layer is made of $Al_zGa_{1-z}As$ (where $0 \leq z \leq 1$), and
    wherein the first multilayer structure includes semiconductor layers made of $(Al_xGa_{1-x})_yIn_{1-y}P$ (where $0 \leq x \leq 1$ and $0 \leq y \leq 1$).

8. A semiconductor laser device comprising:
    a buffer layer formed on a compound semiconductor substrate;
    an etching control layer, which is formed on a first region of the buffer layer and has a composition different from a composition of the substrate;
    a first semiconductor laser structure, which is defined in a first region on the etching control layer and which is made up of a first multiple semiconductor layers including a first active layer with a composition different from that of the etching control layer; and
    a second semiconductor laser structure, which is defined on a second region of the buffer layer and which is made up of a second multiple semiconductor layers including a second active layer,
    wherein the first multiple semiconductor layers are made of III-V compound, the V element is one selected from the group consisting of As and P,
    wherein the second multiple semiconductor layers are made of III-V compound, the V element is another selected from the group consisting of As and P, and
    wherein the etching control layer has a V element different from the V element comprising of the first multiple semiconductor layers.

* * * * *